United States Patent
Tanabe

(10) Patent No.: US 7,901,840 B2
(45) Date of Patent: Mar. 8, 2011

(54) MASK BLANK TRANSPARENT SUBSTRATE MANUFACTURING METHOD, MASK BLANK MANUFACTURING METHOD, AND EXPOSURE MASK MANUFACTURING METHOD

(75) Inventor: Masaru Tanabe, Kitakoma-gun (JP)

(73) Assignee: Hoya Corporation, Tokyo (JP)

( * ) Notice: Subject to any disclaimer, the term of this patent is extended or adjusted under 35 U.S.C. 154(b) by 764 days.

(21) Appl. No.: 11/362,353

(22) Filed: Feb. 27, 2006

(65) Prior Publication Data

US 2006/0194126 A1    Aug. 31, 2006

(30) Foreign Application Priority Data

Feb. 25, 2005 (JP) .................................. 2005-50936

(51) Int. Cl.
*G03F 1/00* (2006.01)
*G03C 5/00* (2006.01)
(52) U.S. Cl. ............................................... 430/5; 430/30
(58) Field of Classification Search .................. 430/5, 30
See application file for complete search history.

(56) References Cited

U.S. PATENT DOCUMENTS

| | | | |
|---|---|---|---|
| 6,727,565 B2 * | 4/2004 | Itoh | 257/435 |
| 6,740,208 B2 * | 5/2004 | Kureishi et al. | 204/192.12 |
| 2004/0192063 A1 | 9/2004 | Koike | |
| 2005/0019678 A1 | 1/2005 | Nakatsu et al. | |
| 2006/0223224 A1 * | 10/2006 | Akagawa | 438/106 |

FOREIGN PATENT DOCUMENTS

| | | |
|---|---|---|
| JP | 8-31723 A | 2/1996 |
| JP | 2003050458 A | 2/2003 |
| JP | 2003-81654 A | 3/2003 |
| JP | 2003315980 A | 11/2003 |
| JP | 2004-46259 A | 2/2004 |
| JP | 2005043837 A | 2/2005 |
| WO | 2004083961 A1 | 9/2004 |

OTHER PUBLICATIONS

Japanese Office Action corresponding to Japanese Patent Application No. 2005-050936, dated Aug. 18, 2010.

* cited by examiner

*Primary Examiner* — Stephen Rosasco
*Assistant Examiner* — Jonathan Jelsma
(74) *Attorney, Agent, or Firm* — Sughrue Mion, PLLC

(57) ABSTRACT

A method includes a preparation step of preparing a transparent substrate having a precision-polished main surface, a surface shape information obtaining step of obtaining, as surface shape information, height information at a plurality of measurement points on the main surface of the transparent substrate that contacts a mask stage of an exposure apparatus, a simulation step of obtaining, based on the surface shape information and shape information of the mask stage, height information at the plurality of measurement points by simulating the state where the transparent substrate is set in the exposure apparatus, a flatness calculation step of calculating, based on the height information obtained through the simulation, a flatness of the transparent substrate when it is set in the exposure apparatus, a judging step of judging whether or not the calculated flatness satisfies a specification, and a thin film forming step of forming a thin film as serving as a mask pattern, on the main surface of the transparent substrate whose flatness satisfies the specification.

15 Claims, 5 Drawing Sheets

MASK BLANK TRANSPARENT SUBSTRATE MANUFACTURING METHOD, MASK BLANK MANUFACTURING METHOD, AND EXPOSURE MASK MANUFACTURING METHOD

This invention claims priority to prior Japanese patent application JP 2005-50936, the disclosure of which is incorporated herein by reference.

BACKGROUND OF THE INVENTION

This invention relates to a method of manufacturing a transparent substrate for a mask blank suitable for a short wavelength region where the exposure wavelength is 200 nm or less, and further relates to a mask blank manufacturing method and an exposure mask manufacturing method.

In recent years, following the miniaturization of semiconductor devices, exposure light sources used in the photolithography technique have been changing to an ArF excimer laser (exposure wavelength: 193 nm) and an F2 excimer laser (exposure wavelength: 157 nm) so that reduction in exposure wavelength has been proceeding.

When the exposure wavelength becomes 200 nm or less, the depth of focus of an exposure apparatus becomes extremely small. Accordingly, if an exposure mask is deformed to reduce its flatness when the exposure mask is set in the exposure apparatus by vacuum suction or the like, the focus position is shifted upon transferring a mask pattern of the exposure mask onto a semiconductor substrate as a transfer target. In this manner, transfer accuracy is often reduced.

In order to solve this problem, JP-A-2004-46259 (hereinafter will be referred to as a patent document 1) discloses a technique in which the flatness of a mask blank for producing an exposure mask, when it is set in an exposure apparatus, is estimated by calculation through simulation and an exposure mask is produced from the mask blank in which estimated flatness is excellent.

Specifically, a mask blank is produced by forming a light-shielding film (an opaque film) on a transparent substrate, and the surface shape (one of four kinds, i.e. convex shape, concave shape, saddle shape, and semicylindrical shape) of the main surface of the mask blank and the flatness of the mask blank (a difference between the highest point and the lowest point of the main surface of the mask blank with respect to a certain reference plane) are derived by measurement. Then, from the thus derived flatness of the mask blank and a structure of a mask stage of an exposure apparatus, the flatness of the mask blank, when it is set on the mask stage of the exposure apparatus, is derived through simulation by the use of a finite element method or the like. When the flatness of the mask blank derived through the simulation satisfies a specification, an exposure mask is produced from such a mask blank.

However, in the technique of patent document 1, those data that are used upon carrying out the simulation for deriving the flatness of the mask blank when it is set in the exposure apparatus are the flatness (the difference between the highest point and the lowest point of the main surface of the mask blank with respect to the certain reference plane) and the surface shape (one of four kinds, i.e. convex shape, concave shape, saddle shape, and semicylindrical shape).

When the main surface of the transparent substrate is precision-polished, its surface shape is complicated, i.e. for example, having waviness or in combination of convex and concave shapes, and therefore, there is a case where the surface shape does not correspond to any one of the foregoing four kinds. Accordingly, even by forcibly applying the complicated surface state of the main surface to the flatness of the mask blank and the simple surface shape (convex shape, concave shape, or the like) to derive, through the simulation, the flatness of the mask blank when it is set in the exposure apparatus, the derived flatness may not agree to a flatness of an exposure mask produced from the mask blank when the exposure mask is actually set in the exposure apparatus.

Further, in the technique of patent document 1, the data (surface shape and flatness) that are used upon carrying out the simulation for deriving the flatness of the mask blank when it is set in the exposure apparatus are those of the mask blank having the light-shielding film formed on the transparent substrate.

After a mask blank is produced by forming a light-shielding film on a transparent substrate, if the flatness and the surface shape of this mask blank are measured, quite a large number of particles adhere to the light-shielding film to cause defects. When the exposure wavelength reaches a short wavelength region of 200 nm or less, the safety margin is reduced in a specification determining the size and number of defects and a specification of optical properties (e.g. deviation of transmittance etc. from design values and in-plane variation in transmittance etc. on the main surface). As a consequence, the mask blank may not satisfy those specifications.

Further, in the case where a film stress of the light-shielding film of the mask blank is large, when an exposure mask is produced by patterning the light-shielding film, a difference possibly occurs between the flatness of the mask blank derived through simulation and the flatness of the exposure mask when it is actually set in an exposure apparatus, depending on the shape of a pattern of the light-shielding film, the occupation ratio of the pattern of the light-shielding film on the main surface of the transparent substrate, and so on, particularly when the light-shielding film is reduced. Accordingly, there is a possibility that the flatness cannot be accurately estimated.

SUMMARY OF THE INVENTION

It is therefore an object of this invention to provide a mask blank transparent substrate manufacturing method that is capable of manufacturing a mask blank transparent substrate by accurately calculating (estimating), through simulation, a flatness of the transparent substrate when it is set in an exposure apparatus.

It is another object of this invention to provide a mask blank manufacturing method that is capable of manufacturing a mask blank by accurately calculating (estimating), through simulation, a flatness of a transparent substrate when it is set in an exposure apparatus and that is capable of suppressing generation of defects.

It is a still another object of this invention to provide an exposure mask manufacturing method for manufacturing an exposure mask by the use of such a mask blank.

In order to solve the above-mentioned objects, this invention has the following aspects.

(First Aspect)

According to a first aspect of this invention, there is provided a method of manufacturing a mask blank transparent substrate, comprising:

a preparation step of preparing a transparent substrate having a precision-polished main surface;

a surface shape information obtaining step of obtaining, as surface shape information of the main surface, height information from a reference plane at a plurality of measurement points provided in a predetermined region on the main surface of the transparent substrate that contacts a mask stage of an exposure apparatus;

a simulation step of obtaining, based on the surface shape information obtained in the surface shape information obtaining step and shape information of the mask stage including a region where the mask stage contacts the main surface of the transparent substrate, height information from the reference plane at the plurality of measurement points by simulating the state where the transparent substrate is set in the exposure apparatus;

a flatness calculation step of deriving, based on the height information from the reference plane obtained in the simulation step, a difference between a maximum value and a minimum value in a predetermined region including a transfer region of an exposure mask to thereby obtain a flatness of the transparent substrate when the transparent substrate is set in the exposure apparatus; and a judging step of judging whether or not the flatness calculated in the flatness calculation step satisfies a specification.

(Second Aspect)

According to a second aspect of this invention, in the first aspect, the predetermined region on the main surface of the transparent substrate where the surface shape information is obtained in the surface shape information obtaining step is set so as to include the region where the mask stage of the exposure apparatus contacts the main surface.

(Third Aspect)

According to a third aspect of this invention, in the second aspect, the predetermined region on the main surface of the transparent substrate where the surface shape information is obtained in the surface shape information obtaining step is set to be a region excluding a peripheral region of more than 0 mm and no more than 3 mm from a chamfered surface of the transparent substrate.

(Fourth Aspect)

According to a fourth aspect of this invention, there is provided a method of manufacturing a mask blank, comprising:

a preparation step of preparing a transparent substrate having a precision-polished main surface;

a surface shape information obtaining step of obtaining, as surface shape information of the main surface, height information from a reference plane at a plurality of measurement points provided in a predetermined region on the main surface of the transparent substrate that contacts a mask stage of an exposure apparatus;

a simulation step of obtaining, based on the surface shape information obtained in the surface shape information obtaining step and shape information of the mask stage including a region where the mask stage contacts the main surface of the transparent substrate, height information from the reference plane at the plurality of measurement points by simulating the state where the transparent substrate is set in the exposure apparatus;

a flatness calculation step of deriving, based on the height information from the reference plane obtained in the simulation step, a difference between a maximum value and a minimum value in a predetermined region including a transfer region of an exposure mask to thereby obtain a flatness of the main surface of the transparent substrate when the transparent substrate is set in the exposure apparatus;

a judging step of judging whether or not the flatness calculated in the flatness calculation step satisfies a specification; and a thin film forming step of forming a thin film serving as a mask pattern, on the main surface of the transparent substrate of which the flatness of the main surface is judged to satisfy the specification in the judging step.

(Fifth Aspect)

According to a fifth aspect of this invention, in the fourth aspect, the predetermined region on the main surface of the transparent substrate where the surface shape information is obtained in the surface shape information obtaining step is set so as to include the region where the mask stage of the exposure apparatus contacts the main surface.

(Sixth Aspect)

According to a sixth aspect of this invention, in the fifth aspect, the predetermined region on the main surface of the transparent substrate where the surface shape information is obtained in the surface shape information obtaining step is set to be a region excluding a peripheral region of more than 0 mm and no more than 3 mm from a chamfered surface of the transparent substrate.

(Seventh Aspect)

According to a seventh aspect of this invention, the forth aspect further comprising a film stress control step of reducing a film stress of the thin film at the time of and/or after carrying out the thin film forming step.

(Eighth Aspect)

According to an eighth aspect of this invention, in the seventh aspect, the film stress control step is carried out by heating the thin film to 150° C. or more.

(Ninth Aspect)

According to a ninth aspect of this invention, in the fourth aspect, a surface shape of the main surface of the transparent substrate on a side where the thin film is formed is a shape such that a height of the main surface is gradually lowered from a center region to a peripheral portion.

(Tenth Aspect)

According to a tenth aspect of this invention, there is provided a method of manufacturing an exposure mask, comprising: patterning the thin film in the mask blank obtained by the mask blank manufacturing method according to the fourth aspect so as to form a thin film pattern on the transparent substrate.

(Eleventh Aspect)

According to an eleventh aspect of this invention, there is provided a method of manufacturing a semiconductor device, comprising: setting an exposure mask obtained by an exposure mask manufacturing method according to the tenth aspect and transferring a thin film pattern of the exposure mask to a resist film on a semiconductor substrate.

According to the invention of the first, second, fourth or fifth aspect, the following effect can be achieved. Based on the height information from the reference plane at the plurality of measurement points on the main surface of the transparent substrate and so on, the simulation in the state where the transparent substrate is set in the exposure apparatus is carried out. In the simulation, the height information from the reference plane, while the transparent substrate is set in the exposure apparatus, is obtained at the plurality of measurement points on the main surface of the transparent substrate. The flatness of the transparent substrate when it is set in the exposure apparatus is calculated based on the height information obtained in the simulation and, therefore, this flatness can be estimated with high accuracy. Therefore, by manufacturing an exposure mask from a mask blank that is manufactured based on this accurately calculated flatness of the transparent substrate, the exposure mask satisfies a specification with respect to flatness, pattern position accuracy, and so on. Accordingly, upon performing pattern transfer by the use of such an exposure mask, it is possible to improve the transfer accuracy.

Further, the thin film forming step that forms the thin film on the transparent substrate (mask blank transparent substrate) is carried out after the surface shape information obtaining step, the simulation step, and the flatness calculation step. As a consequence, particles do not adhere to the thin film in those steps. Therefore, it is possible to suppress generation of defects on the mask blank to be manufactured.

According to the invention of the third or sixth aspect, the following effect can be achieved. The predetermined region of the main surface for obtaining the surface shape information in the surface shape information obtaining step is the region excluding the peripheral region of more than 0 mm and no more than 3 mm from the chamfered surface of the transparent substrate. As a consequence, the surface shape information in this predetermined region can be measured with high accuracy.

According to the invention of the seventh or eighth aspect, the following effect can be achieved. The film stress control step for reducing the film stress of the thin film is carried out at the time of and/or after carrying out the thin film forming step. Therefore, even when the film stress that deforms the transparent substrate (mask blank transparent substrate) is present in the thin film formed on the transparent substrate, this film stress can be reduced. As a result, it is possible to make consistency between the flatness of the transparent substrate which is calculated from the height information at the plurality of measurement points obtained by simulating the state where the transparent substrate is set in the exposure apparatus, and the flatness of the exposure mask obtained when the mask blank is manufactured by forming the thin film on the transparent substrate (mask blank transparent substrate), then the exposure mask is manufactured from this mask blank, and then this exposure mask is actually set in the exposure apparatus.

According to the invention of the ninth aspect, the following effect can be achieved. The surface shape of the main surface of the transparent substrate on the side where the thin film is formed is the shape such that the height of the main surface is gradually lowered from its center region to its peripheral portion. Therefore, when the exposure mask manufactured from the transparent substrate (mask blank transparent substrate) having such a shape is set in the exposure apparatus, the flatness of the exposure mask becomes excellent. Accordingly, it is possible to satisfy the specification required for the exposure mask.

According to the invention of the tenth aspect, the following effect can be achieved. The exposure mask is manufactured by patterning the thin film in the mask blank so as to form the thin film pattern on the transparent substrate (mask blank transparent substrate). Therefore, this exposure mask can satisfy the specification with respect to flatness, pattern position accuracy, and so on when it is set in the exposure apparatus. Accordingly, upon performing pattern transfer by the use of such an exposure mask, it is possible to improve the transfer accuracy.

According to the invention of the eleventh aspect, the following effect can be achieved. By the use of the exposure mask excellent in flatness and pattern position accuracy when it is set in the exposure apparatus, pattern transfer can be carried out onto a resist film formed on the substrate. Therefore, it is possible to manufacture the semiconductor apparatus with an accurate pattern exactly as designed and free from a pattern defect.

DESCRIPTION OF THE PREFERRED EMBODIMENT

Now, description will be made about a preferred embodiment of this invention with reference to the drawings.

Figure 1:
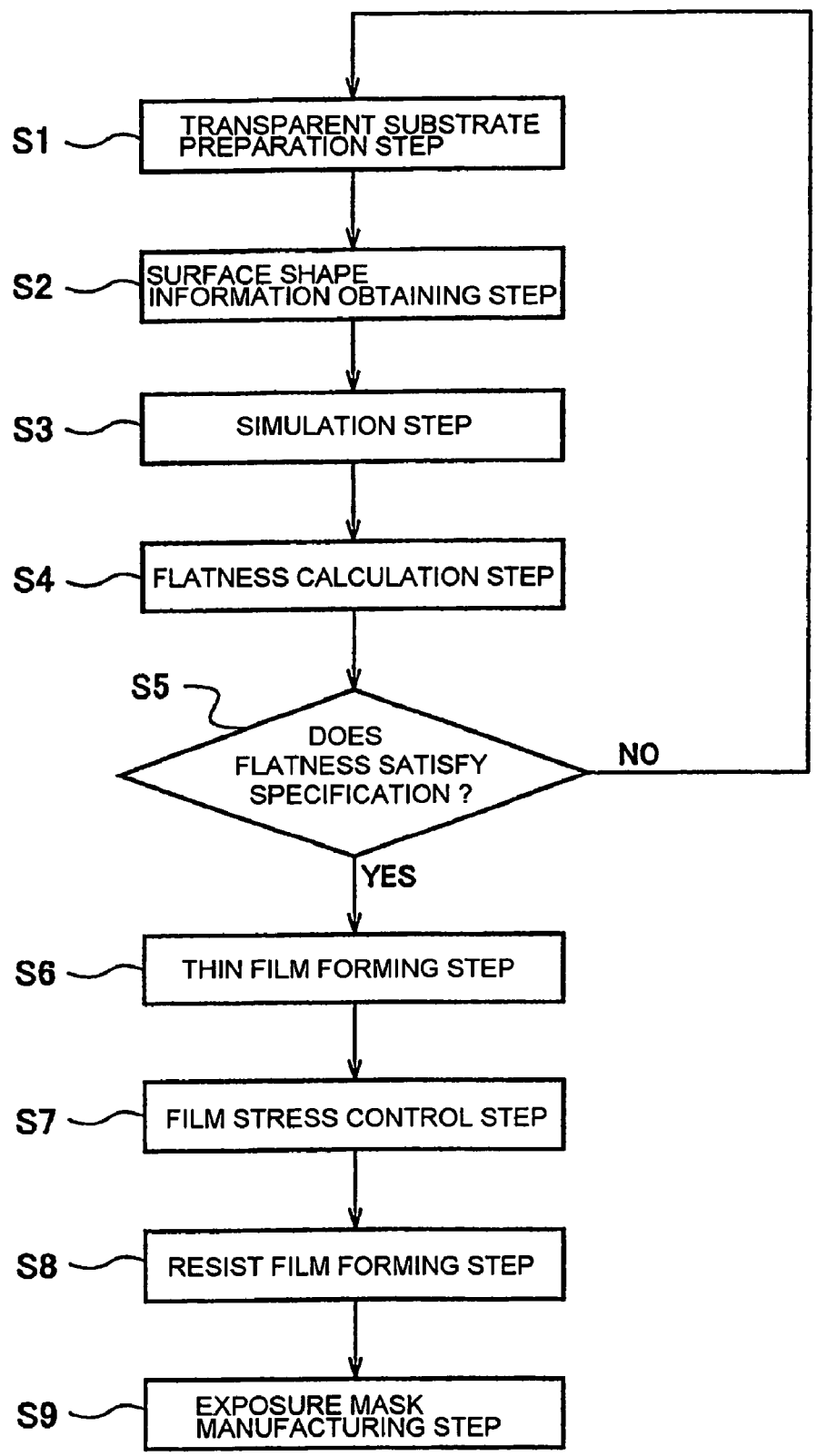
FIG. 1 is a flowchart showing a halftone phase shift mask blank manufacturing method applied with an embodiment of a mask blank manufacturing method according to this invention.

FIG. 1 is a flowchart showing a halftone phase shift mask blank manufacturing method applied with an embodiment of a mask blank manufacturing method according to this invention.

The mask blank manufacturing method shown in FIG. 1 comprises a transparent substrate (synthetic quartz glass substrate) preparation step (S1), a surface shape information obtaining step (S2), a simulation step (S3), a flatness calculation step (S4), a judging step (S5), a thin film forming step (S6), a resist film forming step (S8), and an exposure mask manufacturing step (S9). When a film stress that contributes to deformation of a transparent substrate is present in a thin film formed on the transparent substrate, a film stress control step (S7) may be provided for the purpose of reducing the film stress.

On the other hand, a mask blank transparent substrate manufacturing method according to this invention comprises the transparent substrate (synthetic quartz glass substrate) preparation step (S1), the surface shape information obtaining step (S2), the simulation step (S3), the flatness calculation step (S4), and the judging step (S5) shown in FIG. 1. Hereinbelow, the foregoing respective steps will be described in sequence.

(A) Transparent Substrate Preparation Step (S1)

Chamfering is applied to a synthetic quartz glass plate obtained by cutting a synthetic quartz glass ingot, manufactured by a method described in JP-A-H08-31723 or JP-A-2003-81654, into a size of about 152 mm×about 152 mm×about 6.5 mm, then, main surfaces 1 and 2, end surfaces 3, and chamfered surfaces 4 (see FIG. 2) being the surfaces of the synthetic quartz glass plate are mirror-polished, and further, the main surfaces 1 and 2 are precision-polished. In this manner, a transparent substrate (synthetic quartz glass substrate) 5 is prepared. A thin film (semi-transmissive film) is formed on the main surface 1 in the thin film forming step S6. In the transparent substrate preparation step S1, the surface roughness of the main surfaces 1 and 2 of the transparent substrate 5 is set to about 0.2 nm or less by root mean square (RMS) roughness while the surface roughness of the end surfaces 3 and the chamfered surfaces 4 is set to about 0.03 μm or less by arithmetic average roughness (Ra).

(B) Surface Shape Information Obtaining Step (S2)

As means for obtaining surface shape information of the main surface 1 of the transparent substrate 5, use can be made of, for example, a flatness measuring apparatus (not shown) utilizing a known optical interferometer. In order to suppress as much as possible deflection of the transparent substrate 5 due to its self-weight, the apparatus is preferably of the type that can measure the flatness while the transparent substrate 5 is stood upright or substantially upright. Herein, the surface shape information represents, as shown in FIG. 2, height information Zk (k is an integer) from a reference plane 7 (a focal plane calculated by the method of least squares) at a plurality of measurement points P (Xm, Yn) (m and n are integers) in a predetermined region (a×a) provided on the main surface 1 of the transparent substrate 5. It is preferable that the height information Zk is measured as accurately as possible and, particularly, is measured in the order of nanometers.

The predetermined region (a×a) for measuring the surface shape information is properly selected according to a size of the transparent substrate 5, a measurement accuracy of the flatness measuring apparatus, a region where a mask stage 8 (see FIG. 3) of an exposure apparatus (not shown) contacts the main surface 1 of the transparent substrate 5, and so on. It is preferable to obtain the surface shape information over the entire region of the main surface 1 of the transparent substrate 5 in order to carry out a later-described simulation with high accuracy. However, it is set to include at least the region where the mask stage 8 of the exposure apparatus contacts the main surface 1 of the transparent substrate 5.

Figures 2A, 2B:
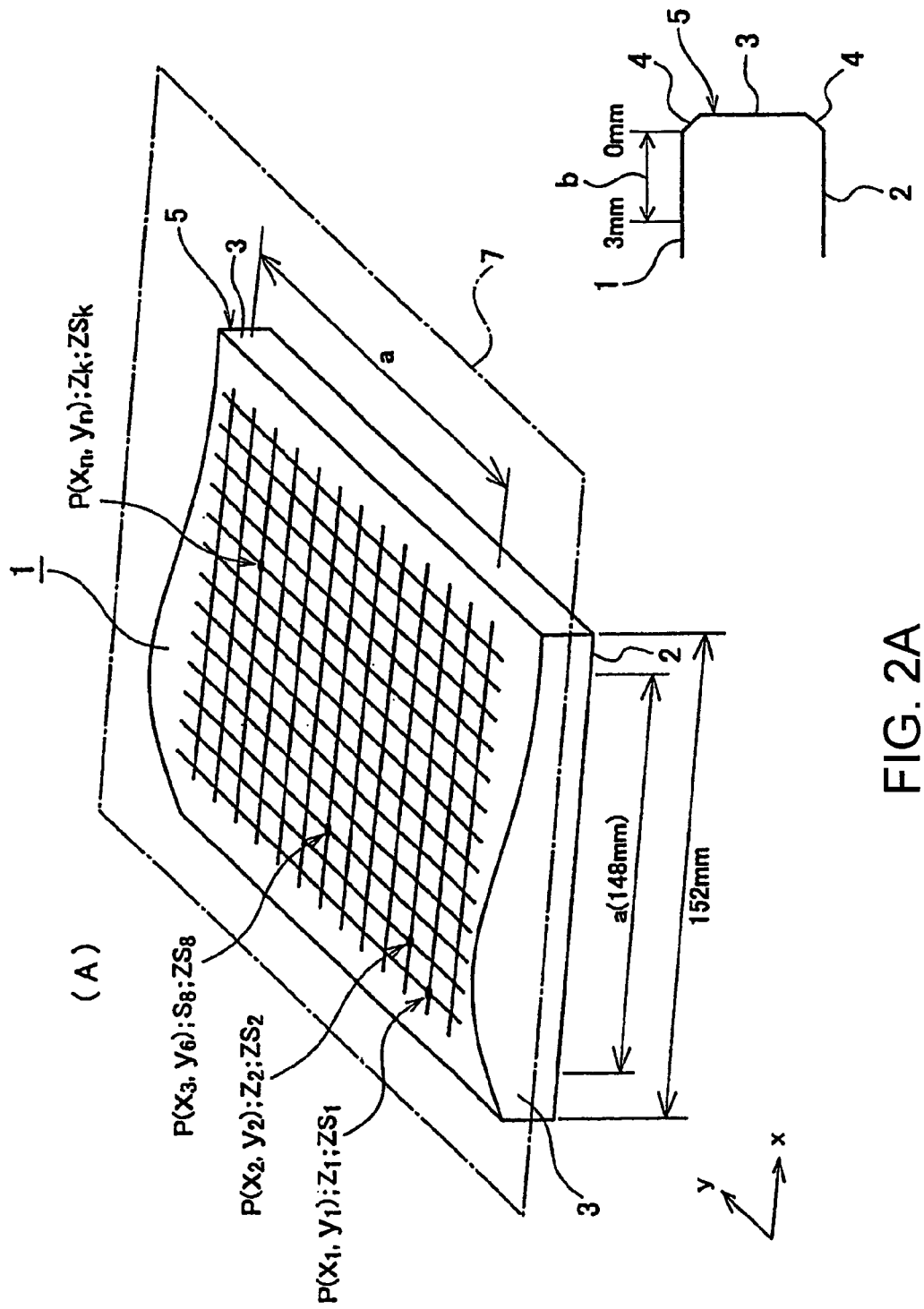
FIG. 2A is a perspective view of a transparent substrate for explaining measurement points upon obtaining surface shape information and upon calculating height information through simulation.
FIG. 2B is an enlarged view showing a part in FIG. 2A.

In the case of the flatness measuring apparatus utilizing the existing optical interferometer, it is difficult to accurately measure the height information Zk at the peripheral portion of the transparent substrate 5, i.e. near the boundary between the main surface 1 and each end surface 3 (or each chamfered surface 4) as shown in FIG. 2B. In consideration of these points, the predetermined region (a×a) of the main surface 1 for obtaining the surface shape information is preferably set to a region derived by excluding, from the entire region of the main surface 1, a peripheral region b of more than 0 mm and no more than 3 mm from each chamfered surface 4 of the transparent substrate 5. Particularly, the predetermined region (a×a) for obtaining the surface shape information is preferably set to a region derived by excluding, from the entire region of the main surface 1, a peripheral region b of no less than 0.5 mm and no more than 2.5 mm from each chamfered surface 4 of the transparent substrate 5 and is more preferably set to a region derived by excluding, from the entire region of the main surface 1, a peripheral region b of no less than 1 mm and no more than 2 mm from each chamfered surface 4 of the transparent substrate 5. For example, in the case of the transparent substrate 5 having a size of 152 mm×152 mm, the predetermined region (a×a) for obtaining the surface shape information is preferably set to a size of 146 mm×146 mm and more preferably a size of 148 mm×148 mm.

Further, in order to carry out the later-described simulation with high accuracy, it is preferable that the measurement points P (Xm, Yn) are set as many as possible. However, although more accurate simulation results can be achieved by increasing the number of the measurement points P (Xm, Yn), the simulation requires a lot of time. Therefore, it is preferable to determine the measurement points P (Xm, Yn) taking these points into account. For example, the measurement points P (Xm, Yn) can be set to 256×256 points.

(C) Simulation Step (S3)

In this simulation step, as shown in FIG. 3, by simulating the state where the transparent substrate 5 is set on the mask stage 8 of the exposure apparatus, height information ZSk (k is an integer) from the reference plane 7 (see FIG. 2A) is derived at the plurality of measurement points P (Xm, Yn) on the main surface 1 of the transparent substrate 5.

The conditions necessary for obtaining, through simulation, the height information ZSk (see FIG. 2A) at the plurality of measurement points P (Xm, Yn) on the transparent substrate 5 when it is set in the exposure apparatus are the height information Zk from the reference plane 7 at the plurality of measurement points P (Xm, Yn) on the main surface 1 of the transparent substrate 5, which is obtained in the surface shape information obtaining step S2, and shape information of the mask stage 8 of the exposure apparatus including regions where the mask stage 8 contacts the main surface 1 of the transparent substrate 5 (i.e. regions each having an X-direction width L2 and a Y-direction width L3 in the mask stage 8). The shape information of the mask stage 8 includes the width L2, the width L3, and a distance L1 between those regions each having the X-direction width L2 and the Y-direction width L3. According to a deflection differential equation in mechanics of materials by the use of these information, it is possible to obtain, through simulation, the height information ZSk from the reference plane 7 at the plurality of measurement points P (Xm, Yn) on the main surface 1 of the transparent substrate 5 when it is set on the mask stage 8 of the exposure apparatus.

The foregoing deflection differential equation is derived in the following manner, wherein a positive direction of Z-axis is defined as the direction of gravity.

(height information ZSk on the main surface of the transparent substrate when it is set on the mask stage)
=(height information Zk on the main surface of the transparent substrate obtained in the surface shape information obtaining step S2)
+(a warp of the transparent substrate along X-direction with respect to the mask stage as fulcrums (lever effect))
+(a deflection of the transparent substrate along X-direction due to gravity (≅0.1 μm: maximum value at the center of the transparent substrate))
−(an average value of height information Zk of the transparent substrate in regions along Y-direction where the transparent substrate contacts the mask stage)

Figure 3A:
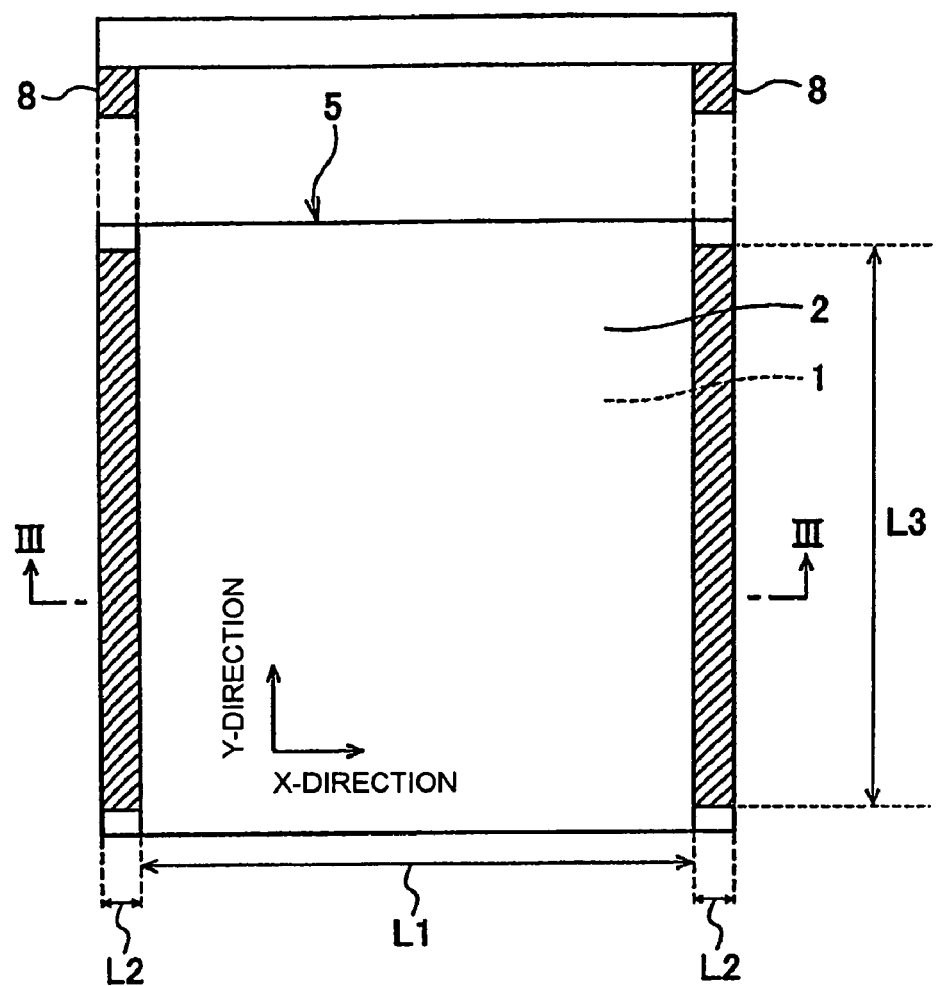
FIG. 3A is a plan view showing the state where the transparent substrate is set on a mask stage of an exposure apparatus.
Figure 3B:
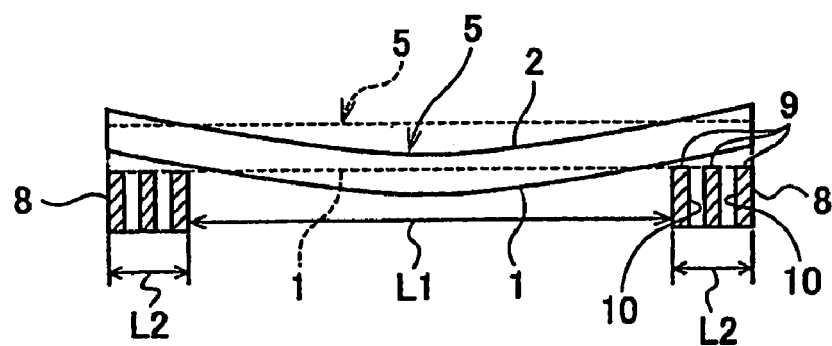
FIG. 3B is a sectional view taken along a line III-III in FIG. 3A.

Herein, the X- and Y-directions are identified in FIG. 3A. The X-direction is a direction perpendicular to a longitudinal direction of the mask stage 8 while the Y-direction is a direction along the longitudinal direction of the mask stage 8. Further, "regions along Y-direction where the transparent substrate contacts the mask stage" are derived from the regions, as the shape information of the mask stage 8, where the mask stage 8 contacts the main surface 1 of the transparent substrate 5. In FIG. 3B, the transparent substrate 5 in solid line shows the state before it is set (held by suction) on the mask stage 8, while, the transparent substrate 5 in broken line shows the state after it is set (held by suction) on the mask stage 8.

Thus, the simulation is performed based on the foregoing surface shape information taking into account the complicated surface state of the main surface 1 of the transparent substrate 5 (i.e. the height information Zk from the reference plane 7 at the plurality of measurement points P (Xm, Yn)) and so on. Therefore, highly accurate simulation results can be obtained as compared with the case of performing the simulation with the simple conditions, i.e. the surface shape and the single flatness of the main surface of the transparent substrate, as described in patent document 1.

More accurate simulation results can be obtained if, instead of using the single value (0.1 μm) as described above, the gravitational deformation of the transparent substrate 5 is estimated by the use of a quartic surface having the maximum value (0.1 μm) on a center line of the transparent substrate 5 (a line passing through the center of the transparent substrate 5 and being parallel to Y-direction of the mask stage 8) so as to be considered at respective positions of the transparent substrate 5 in X-direction. Further, the foregoing shape information of the mask stage 8 may include, in addition to the regions where the mask stage 8 contacts the main surface 1 of the transparent substrate 5 (i.e. the regions each having the X-direction width L2 and the Y-direction width L3), information about flatness of the mask stage 8 in the foregoing regions (surfaces) where the mask stage 8 contacts the main surface 1 of the transparent substrate 5. Moreover, the simulation method is not limited to the above-mentioned method and a simulation using the general finite element method may be used.

(D) Flatness Calculation Step (S4)

Figure 4:
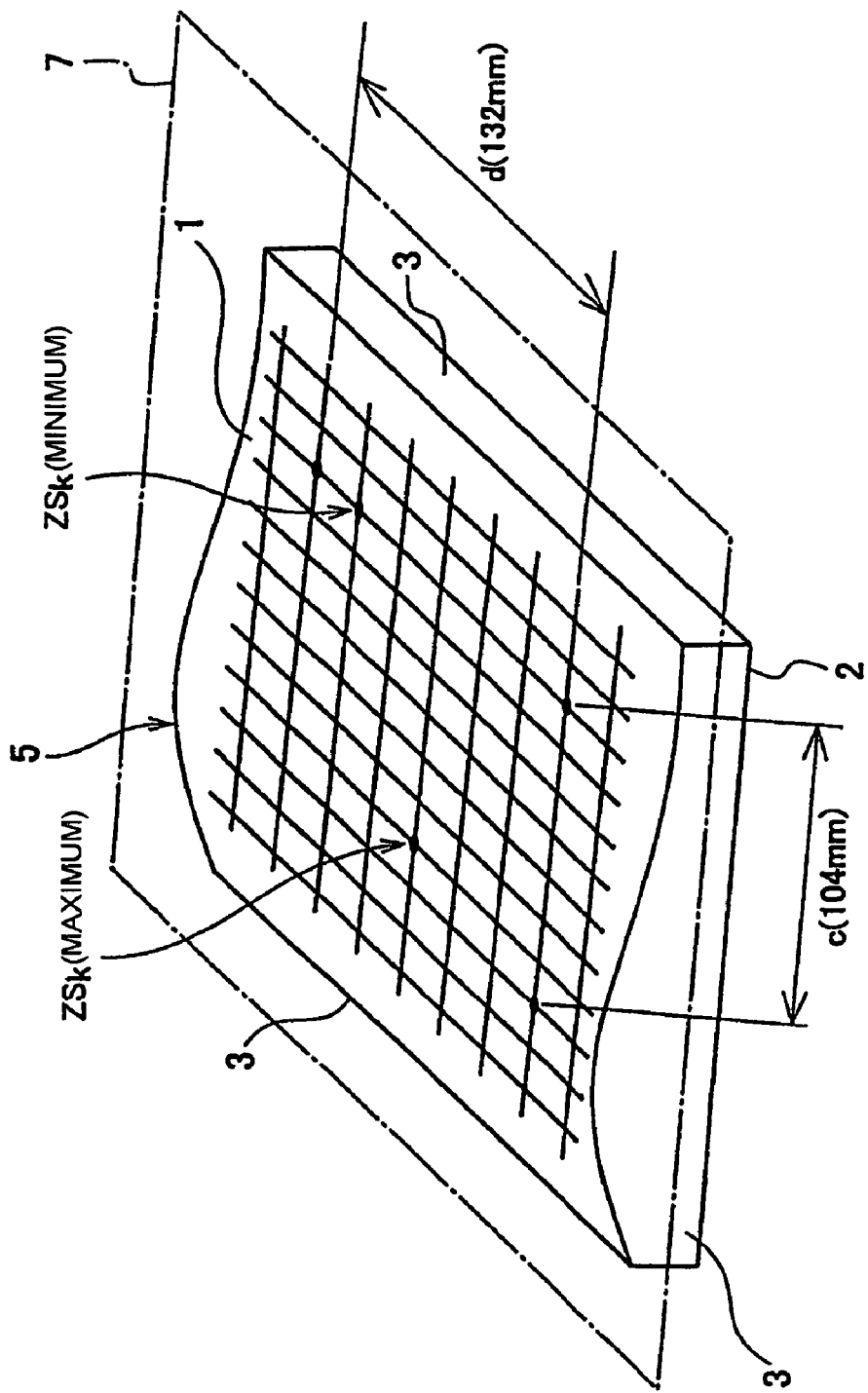
FIG. 4 is a perspective view of the transparent substrate for explaining measurement points upon calculating a flatness.

In this flatness calculation step, as shown in FIG. 4, a maximum value and a minimum value are derived in a predetermined region (c×d) including a transfer region of an exposure mask (not shown) from the height information ZSk from the reference plane 7 obtained in the foregoing simulation step S3. In this manner, a flatness on the main surface 1 of the transparent substrate 5 is calculated when it is set in the exposure apparatus. This flatness contributes to formation of an excellent transfer pattern at the time of pattern transfer using the exposure apparatus. The predetermined region (c×d) including the transfer region of the exposure mask is determined based on an exposure wavelength, the kind of a fine pattern (circuit pattern) to be formed on a semiconductor wafer, and so on. For example, in the case of a mask blank having a size of 152 mm×152 mm, the predetermined region (c×d) including the transfer region of the mask can be set to a rectangular shape of 104 mm×132 mm or a square shape of 132 mm×132 mm.

(E) Judging Step (S5)

The flatness calculated in the foregoing flatness calculation step S4 is compared with a predetermined specification to thereby judge whether it satisfies the specification. The transparent substrate 5 judged to satisfy the specification is specified as a mask blank transparent substrate 5A. Only this mask blank transparent substrate 5A is subjected to the thin film forming step S6 in which a thin film is formed on the transparent substrate 5A. In this manner, a mask blank is produced. With respect to the transparent substrate 5 judged not to satisfy the specification, the main surface 1 thereof is processed again to prepare a transparent substrate so that its flatness through simulation satisfies the specification.

The foregoing specification calculates and determines a flatness allowable for a mask blank (or an exposure mask) depending on an exposure wavelength, a substrate chuck structure of a mask stage of an exposure apparatus, and so on. For example, when an exposure light source is an ArF excimer laser (exposure wavelength: 193 nm) and a substrate chuck structure (a support portion structure for the transparent substrate 5) is of the type where, as shown in FIG. 3B, two suction ports 10 are formed between three support portions 9 each linearly extending parallel to the main surface 1 of the transparent substrate 5 and the transparent substrate 5 is chucked (held by suction) to be supported on the support portions 9, the foregoing specification defines a flatness to be 0.24 μm or less in a predetermined region (104 mm×132 mm) including a transfer region of an exposure mask.

Taking into account that the transparent substrate 5 is deformed upward of the mask stage 8 of the exposure apparatus when the transparent substrate 5 is set on the mask stage 8 by vacuum chuck, the surface shape of the main surface 1 on the side where a thin film is formed, i.e. on the side that contacts the mask stage 8, is selected based on the height information Zk obtained in the foregoing surface shape information obtaining step S2 such that the height of the main surface 1 is gradually lowered from its center region to its peripheral portion as shown by a solid line in FIG. 3B. By performing the simulation with respect to this selected transparent substrate 5, the deformation due to the lever effect and the deflection deformation due to gravity are cancelled each other. Therefore, it is preferably possible to obtain the transparent substrate 5 with a better flatness after it is set on the mask stage 8 of the exposure apparatus and thus to satisfy a specification required for an exposure mask.

(F) Thin Film Forming Step (S6)

Figure 5A:
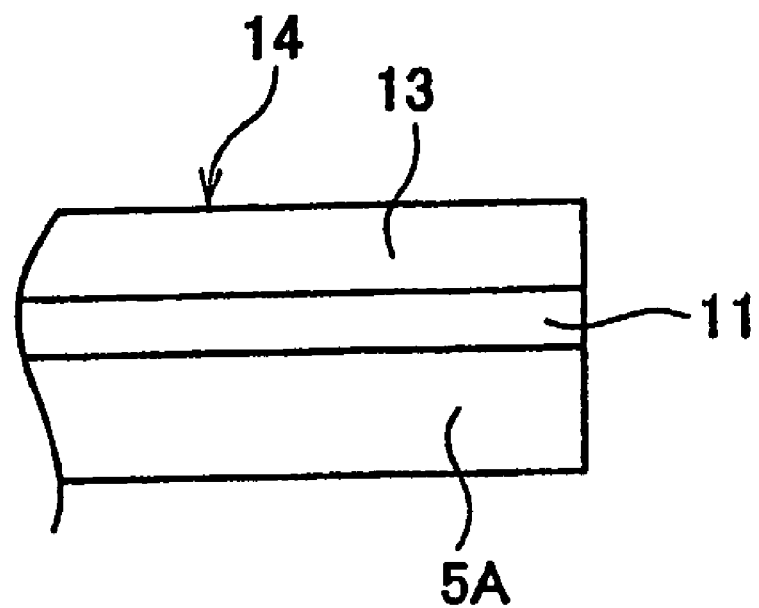
FIGS. 5A and 5B are sectional views shows structures of mask blanks.

After, in the foregoing judging step S5, the flatness of the transparent substrate 5 is judged to satisfy the specification in the state where the transparent substrate 5 is set on the mask stage 8 of the exposure apparatus, a thin film (semi-transmissive film) 11, which will be formed into a mask pattern, is formed on the main surface 1 of the transparent substrate 5 (i.e. the mask blank transparent substrate 5A) by a sputtering method. In this manner, the transparent substrate with the thin film is produced as shown in FIG. 5A. The formation of the thin film (semi-transmissive film) 11 is carried out by the use of, for example, a DC magnetron sputtering apparatus.

(G) Film Stress Control Step (S7)

Figure 5B:
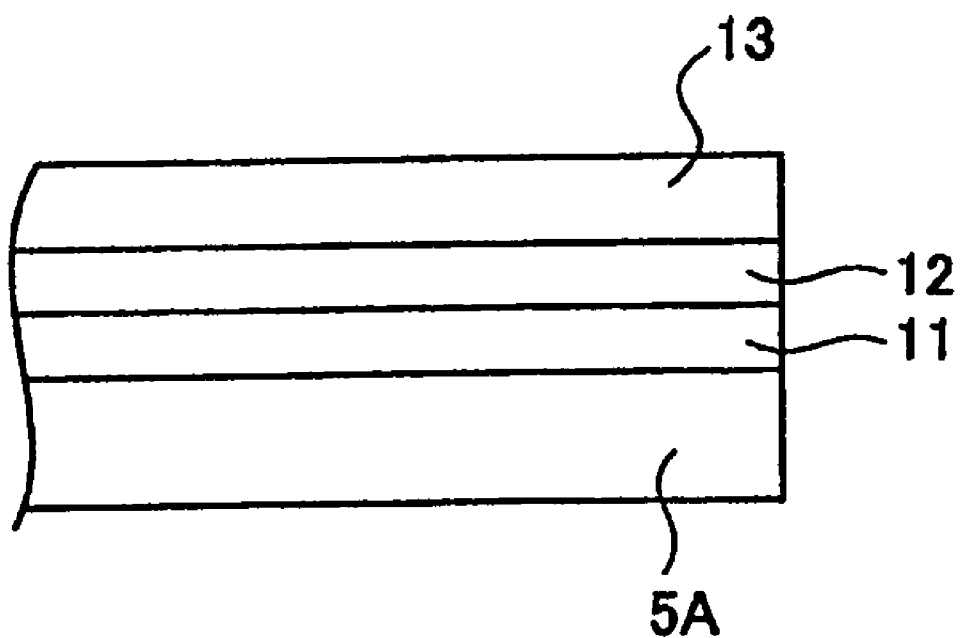

This film stress control step is carried out, for example, in the case where a heat treatment is applied to the transparent substrate with the thin film at a temperature of 150° C. or more at the time of and/or after forming the thin film or in the case where, as shown in FIG. 5B, a thin film formed on the mask blank transparent substrate 5A is formed into a plurality of layers, i.e. the layer (a semi-transmissive film 11) having a compressive stress and the layer (e.g. a light-shielding film 12) having a tensile stress, and the film stresses of the thin films 11 and 12 are cancelled each other. Description will be made about the former case (heat treatment) in this embodiment and Example which will be described later.

(H) Resist Film Forming Step (S8)

Thereafter, a resist is coated on the surface of the semi-transmissive film 11 in the transparent substrate with the thin film (semi-transmissive film 11) and then the heat treatment is carried out to form a resist film 13. Thus, a mask blank 14 (halftone phase shift mask blank) is produced. Measurement is carried out for detecting defects (pinholes and particles) of the mask blank 14 by the use of a defect inspection apparatus.

(I) Exposure Mask Manufacturing Step (S9)

The resist film 13 of the mask blank 14 is subjected to writing of a predetermined pattern and then developed to thereby form a resist pattern (not shown). Subsequently, using this resist pattern as a mask, the semi-transmissive film 11 is dry-etched to thereby form a semi-transmissive film pattern (not shown) as a mask pattern. Finally, the resist pattern (resist film 13) is removed, thereby obtaining an exposure mask (not shown) in which the semi-transmissive film pattern is formed on the mask blank transparent substrate 5A.

(J) Semiconductor Device Manufacturing Step

The obtained exposure mask is set on the mask stage of the exposure apparatus. Using this exposure mask and according to the photolithography technique using an ArF excimer laser as an exposure light source, the mask pattern (semi-transmissive film pattern) of the exposure mask is transferred onto a resist film formed on a semiconductor substrate so as to form a required circuit pattern on the semiconductor substrate. In this manner, a semiconductor device is manufactured.

(K) Effect of the Embodiment

With the structure as described above, the following effects (1) to (5) are achieved according to the foregoing embodiment.

(1) Based on the height information Zk from the reference plane 7 at the plurality of measurement points P (Xm, Yn) on the main surface 1 of the transparent substrate 5 and so on, the simulation in the state where the transparent substrate 5 is set on the mask stage 8 of the exposure apparatus is carried out. In the simulation, the height information ZSk from the reference plane 7 is obtained at the plurality of measurement points P (Xm, Yn) on the main surface 1 of the transparent substrate 5. The flatness of the transparent substrate 5 when it is set on the mask stage 8 of the exposure apparatus is calculated based on the height information ZSk obtained in the simulation. Therefore, this flatness can be estimated with high accuracy. The mask blank transparent substrate 5A is judged and selected based on this flatness of the transparent substrate 5 calculated with high accuracy and the exposure mask is manufactured by the use of the mask blank 14 manufactured from such a mask blank transparent substrate 5A. Therefore, this exposure mask satisfies the specification with respect to flatness, pattern position accuracy, and so on. Accordingly, upon performing pattern transfer onto the semiconductor substrate as a transfer target by the use of such an exposure mask, it is possible to improve the transfer accuracy.

(2) The thin film forming step (S6 in FIG. 1) that forms the thin film 11 on the mask blank transparent substrate 5A is carried out after the surface shape information obtaining step (S2 in FIG. 1), the simulation step (S3 in FIG. 1), and the flatness calculation step (S4 in FIG. 1). As consequence, particles do not adhere to the thin film 11 in those steps and, therefore, it is possible to suppress generation of defects on the mask blank 14 to be manufactured.

(3) The predetermined region (a×a) of the main surface 1 for obtaining the surface shape information in the surface shape information obtaining step (S2 in FIG. 1) is the region derived by excluding, from the entire region of the main surface 1, the peripheral region b of more than 0 mm and no more than 3 mm from each chamfered surface 4 of the transparent substrate 5. As a consequence, the surface shape information (height information Zk from the reference plane 7) in the predetermined region (a×a) can be measured with high accuracy.

(4) The film stress control step (S7 in FIG. 1) for reducing the film stress of the thin film 11 is carried out at the time of and/or after carrying out the thin film forming step (S6 in FIG. 1). As a consequence, even when the film stress that deforms the mask blank transparent substrate 5A is present in the thin film 11 formed on the mask blank transparent substrate 5A, this film stress can be reduced. As a result, it is possible to make consistency between the flatness of the transparent substrate 5 which is calculated from the height information ZSk at the plurality of measurement points P (Xm, Yn) obtained by simulating the state where the transparent substrate 5 is set on the mask stage 8 of the exposure apparatus, and the flatness of the exposure mask obtained when the mask blank 14 is manufactured by forming the thin film 11 on the mask blank transparent substrate 5A, then the exposure mask is manufactured from this mask blank 14, and then this exposure mask is actually set on the mask stage 8 of the exposure apparatus.

(5) The surface shape of the main surface 1 of the transparent substrate 5 on the side where the thin film 11 is formed is the shape such that the height of the main surface 1 is gradually lowered from its center region to its peripheral portion. As a consequence, when the exposure mask manufactured, through the mask blank 14, from the mask blank transparent substrate 5A having such a shape is set on the mask stage 8 of the exposure apparatus, the exposure mask is deformed upward of the mask stage 8 so as to cancel the deflection deformation due to gravity and. Therefore, the flatness of the exposure mask becomes excellent. Accordingly, it is possible to satisfy the specification required for the exposure mask.

EXAMPLE

Hereinbelow, description will be made in detail about steps of manufacturing a halftone phase shift mask blank as a mask blank.

(I) Transparent Substrate Preparation Step

Main surfaces of a square transparent plate (synthetic quartz glass plate) having a size of 152 mm×152 mm were precision-polished and cleaned. Thus, a transparent substrate was prepared.

(II) Surface Shape Information Obtaining Step

By the use of a flatness measuring apparatus (UltraFlat200M manufactured by Corning Tropel) utilizing an optical interferometer, surface shape information (height information from a focal plane (virtual absolute plane) calculated by the method of least squares) was obtained at 256× 256 measurement points in a predetermined region (148 mm×148 mm) on the main surface (the main surface where a thin film was going to be formed) of the transparent substrate and stored in a computer. According to this surface shape information, the surface shape of the main surface (the main surface where the thin film was going to be formed) of the transparent substrate was such that the height of the main surface was gradually lowered from its center region to its peripheral portion, and the flatness in the predetermined region (148 mm×148 mm) was 0.47 μm and thus excellent.

(III) Simulation Step

Based on the surface shape information obtained in the surface shape information obtaining step and shape information of a mask stage of an exposure apparatus in regions (each about 10 mm×132 mm from an end surface of the transparent substrate) where the mask stage contacts the main surface of the transparent substrate, height information from the reference plane when the transparent substrate was set in the exposure apparatus was calculated through simulation at the respective measurement points according to the foregoing deflection differential equation.

(IV) Flatness Calculation Step Judging Step

From the foregoing simulation results, a difference between maximum and minimum values from the reference plane was derived in a predetermined region (104 mm×132 mm) including a transfer region of an exposure mask. In this manner, a flatness in this predetermined region was calculated. As a result, the flatness was 0.21 μm (104 mm×132 mm), which was excellent. Accordingly, the flatness of the main surface of the transparent substrate when it was set on the mask stage of the exposure apparatus was judged to satisfy the specification. Thus, the mask blank transparent substrate was obtained.

(V) Thin Film Forming Step

A semi-transmissive film made of nitrided molybdenum and silicon was formed on the main surface of the mask blank transparent substrate obtained through the simulation based on the surface shape information. Thus, the transparent substrate with the semi-transmissive film was obtained.

(VI) Film Stress Control Step

The transparent substrate with the semi-transmissive film obtained in the thin film forming step was brought in a heat treatment apparatus and applied with a heat treatment at 300° C. for 10 minutes, thereby making zero a film stress of the thin film (semi-transmissive film).

(VII) Resist Film Forming Step

A resist film was formed, by a spin coating method, on the semi-transmissive film of which the film stress was controlled to be zero, then, the resist film was formed to a thickness of 400 nm through a prebake treatment. Thus, a halftone phase shift mask blank for ArF excimer laser exposure was obtained. Measurement was carried out for detecting defects (particles and pinholes) of the halftone phase shift mask blank by the use of a defect inspection apparatus. As a result, the number of defects of 0.1 µm or more was 10 or less, which was quite excellent.

(VIII) Halftone Phase Shift Mask Manufacturing Step

A pattern was exposed onto the resist film of the halftone phase shift mask blank and then developed to thereby form a resist pattern. Successively, exposed portions of the thin film made of nitrided molybdenum and silicon were removed by dry etching ($SF_6$+He gas) to thereby obtain a pattern (semi-transmissive portion) of the thin film made of nitrided molybdenum and silicon. After peeling off the resist film, the mask blank with the thin film pattern was immersed in 99% sulfuric acid ($H_2SO_4$) at 100° C. for 15 minutes so as to be subjected to sulfuric acid cleaning and was then rinsed with pure water or the like. In this manner, a halftone phase shift mask for ArF excimer laser exposure was obtained.

(IX) Semiconductor Device Manufacturing Step

The obtained halftone phase shift mask was set on the mask stage of the exposure apparatus and then the thin film pattern of the halftone phase shift mask was transferred onto a resist film on a semiconductor wafer so as to form a circuit pattern. Thus, a semiconductor device was produced. The obtained semiconductor device was inspected. As a result, it was found that the circuit pattern had no defect and was thus excellent.

COMPARATIVE EXAMPLE

Main surfaces of a square transparent plate (synthetic quartz glass plate) having a size of 152 mm×152 mm were precision-polished and cleaned to thereby prepare a transparent substrate. A semi-transmissive film made of nitrided molybdenum and silicon was formed on the main surface of the obtained transparent substrate In this manner, the transparent substrate with the semi-transmissive film was obtained.

Like in patent document 1, the flatness and the surface shape of this transparent substrate with the semi-transmissive film were measured by the use of the flatness measuring apparatus and, based on the obtained information, the flatness of the transparent substrate with the semi-transmissive film, when it was set on the mask stage of the exposure apparatus, was derived through simulation by the use of the finite element method.

Since the flatness of the transparent substrate with the semi-transmissive film was 0.24 µm or less and was thus judged to satisfy the specification, a semiconductor device was manufactured through a resist film forming step, a halftone phase shift mask manufacturing step, and a semiconductor device manufacturing step. The obtained semiconductor device was inspected. As a result, a number of line-width variation defects of a circuit pattern were found and a number of defects (black defects and white defects) of the circuit pattern were also found.

The line-width variation defects of the circuit pattern are considered to be caused by degradation of pattern focus accuracy due to the fact that the flatness of the transparent substrate with the semi-transmissive film obtained by simulating the state where it is set on the mask stage of the exposure apparatus differs from the flatness of the exposure mask when it is actually set on the mask stage of the exposure apparatus. When defects (particles and pinholes) on the surface of the semi-transmissive film were measured by the defect inspection apparatus after the formation of the resist film, the number of defects of 0.1 µm or more was 1000 or more. The foregoing defects of the circuit pattern are considered to be caused by particles and pinholes of the exposure mask that are generated due to those defects of the semi-transmissive film.

While this invention has been described in terms of the preferred embodiment, the invention is not to be limited thereto. For example, although only the semi-transmissive film is formed on the transparent substrate in the thin film forming step in the foregoing Example, a light-shielding film may be further formed on the semi-transmissive film.

What is claimed is:

1. A method of manufacturing a mask blank transparent substrate, comprising:

a preparation step of preparing a transparent substrate having a precision-polished main surface;

a surface shape information obtaining step of obtaining, as surface shape information of the main surface, height information from a reference plane at a plurality of measurement points provided in a predetermined region on the main surface of the transparent substrate that contacts a mask stage of an exposure apparatus;

a simulation step of obtaining, based on the surface shape information obtained in the surface shape information obtaining step and shape information of the mask stage including a region where the mask stage contacts the main surface of the transparent substrate, height information from the reference plane at the plurality of measurement points by simulating the state where the transparent substrate is set in the exposure apparatus;

a flatness calculation step of deriving, based on the height information from the reference plane obtained in the simulation step, a difference between a maximum value and a minimum value in a predetermined region including a transfer region of an exposure mask to thereby obtain a flatness of the transparent substrate when the transparent substrate is set in the exposure apparatus; and a judging step of judging whether or not the flatness calculated in the flatness calculation step satisfies a specification, wherein the height information in the simulation step is determined based upon a deflection differential equation in mechanics of materials, the deflection differential equation comprising at least (1) the height information obtained in the surface shape information obtaining step, (2) a warp of the transparent substrate along an X-direction with respect to the mask stage as fulcrums, and (3) a deflection of the transparent substrate along the X-direction due to gravity, and wherein the X-direction is a direction perpendicular to a longitudinal direction of the mask stage.

2. A mask blank transparent substrate manufacturing method according to claim 1, wherein the predetermined region on the main surface of the transparent substrate where the surface shape information is obtained in the surface shape information obtaining step is set so as to include the region where the mask stage of the exposure apparatus contacts the main surface.

3. A mask blank transparent substrate manufacturing method according to claim 2, wherein the predetermined region on the main surface of the transparent substrate where the surface shape information is obtained in the surface shape information obtaining step is set to be a region excluding a peripheral region of more than 0 mm and no more than 3 mm from a chamfered surface of the transparent substrate.

4. A mask blank transparent substrate manufacturing method according to claim 1, wherein the deflection differential equation further comprises (4) an average value of height information of the transparent substrate in regions along a Y-direction where the transparent substrate contacts the mask stage, wherein the Y-direction is a direction along the longitudinal direction of the mask stage.

5. A mask blank transparent substrate manufacturing method according to claim 1, wherein
when the flatness calculated in the flatness calculation step does not satisfy the specification in the judging step, a main surface of the judged transparent substrate is processed again in the preparation step so that flatness calculated in the flatness calculation step satisfies the specification.

6. A method of manufacturing a mask blank, comprising:
a preparation step of preparing a transparent substrate having a precision-polished main surface;
a surface shape information obtaining step of obtaining, as surface shape information of the main surface, height information from a reference plane at a plurality of measurement points provided in a predetermined region on the main surface of the transparent substrate that contacts a mask stage of an exposure apparatus;
a simulation step of obtaining, based on the surface shape information obtained in the surface shape information obtaining step and shape information of the mask stage including a region where the mask stage contacts the main surface of the transparent substrate, height information from the reference plane at the plurality of measurement points by simulating the state where the transparent substrate is set in the exposure apparatus;
a flatness calculation step of deriving, based on the height information from the reference plane obtained in the simulation step, a difference between a maximum value and a minimum value in a predetermined region including a transfer region of an exposure mask to thereby obtain a flatness of the main surface of the transparent substrate when the transparent substrate is set in the exposure apparatus;
a judging step of judging whether or not the flatness calculated in the flatness calculation step satisfies a specification; and
a thin film forming step of forming a thin film serving as a mask pattern, on the main surface of the transparent substrate of which the flatness of the main surface is judged to satisfy the specification in the judging step,
wherein the thin film forming step is carried out after the surface shape information obtaining step, the simulation step and the flatness calculation step, wherein the height information in the simulation step is determined based upon a deflection differential equation in mechanics of materials, the deflection differential equation comprising at least (1) the height information obtained in the surface shape information obtaining step, (2) a warp of the transparent substrate along an X-direction with respect to the mask stage as fulcrums, and (3) a deflection of the transparent substrate along the X-direction due to gravity, and
wherein the X-direction is a direction perpendicular to a longitudinal direction of the mask stage.

7. A mask blank manufacturing method according to claim 6, wherein the predetermined region on the main surface of the transparent substrate where the surface shape information is obtained in the surface shape information obtaining step is set so as to include the region where the mask stage of the exposure apparatus contacts the main surface.

8. A mask blank manufacturing method according to claim 7, wherein the predetermined region on the main surface of the transparent substrate where the surface shape information is obtained in the surface shape information obtaining step is set to be a region excluding a peripheral region of more than 0 mm and no more than 3 mm from a chamfered surface of the transparent substrate.

9. A mask blank manufacturing method according to claim 6, further comprising a film stress control step of reducing a film stress of the thin film at the time of and/or after carrying out the thin film forming step.

10. A mask blank manufacturing method according to claim 9, wherein the film stress control step is carried out by heating the thin film to 150° C. or more.

11. A mask blank manufacturing method according to claim 6, wherein a surface shape of the main surface of the transparent substrate on a side where the thin film is formed is a shape such that a height of the main surface is gradually lowered from a center region to a peripheral portion.

12. A method of manufacturing an exposure mask, comprising: patterning the thin film in the mask blank obtained by the mask blank manufacturing method according to claim 6 so as to form a thin film pattern on the transparent substrate.

13. A method of manufacturing a semiconductor device, comprising: setting an exposure mask obtained by an exposure mask manufacturing method according to claim 12 and transferring a thin film pattern of the exposure mask to a resist film on a semiconductor substrate.

14. A mask blank manufacturing method according to claim 6, wherein the deflection differential equation further comprises (4) an average value of height information of the transparent substrate in regions along a Y-direction where the transparent substrate contacts the mask stage,
wherein the Y-direction is a direction along the longitudinal direction of the mask stage.

15. A mask blank manufacturing method according to claim 6, wherein
when the flatness calculated in the flatness calculation step does not satisfy the specification in the judging step, a main surface of the judged transparent substrate is processed again in the preparation step so that flatness calculated in the flatness calculation step satisfies the specification.

* * * * *